United States Patent [19]

Ikeno et al.

[11] Patent Number: 5,135,891
[45] Date of Patent: Aug. 4, 1992

[54] METHOD FOR FORMING FILM OF UNIFORM THICKNESS ON SEMICONDUCTOR SUBSTRATE HAVING CONCAVE PORTION

[75] Inventors: Masahiko Ikeno; Hideo Saeki; Hiroshi Kawashima, all of Hyogo, Japan

[73] Assignee: Mitsubishi Denki Kabushiki Kaisha, Tokyo, Japan

[21] Appl. No.: 297,623

[22] Filed: Jan. 17, 1989

[30] Foreign Application Priority Data

Jan. 19, 1988 [JP] Japan .................................. 63-9957
Sep. 29, 1988 [JP] Japan .................................. 63-245779

[51] Int. Cl.$^5$ ........................................ H01L 21/465
[52] U.S. Cl. ........................................ 437/228; 437/67; 437/229; 437/231
[58] Field of Search .............. 437/229, 67, 231, 228; 430/325, 326

[56] References Cited

U.S. PATENT DOCUMENTS 4,088,490  5/1978  Duke et al. .................... 437/229
4,665,010  5/1987  Herd et al. .................... 437/229

FOREIGN PATENT DOCUMENTS 0150359  8/1985  European Pat. Off. ............ 437/229
59-114823  7/1984  Japan .

OTHER PUBLICATIONS

Wolf and Tauber, "Silicon Processing for the VLSI era-vol. 1-Process Technology", Lattice Press, Sunset Beach, Calif.
Stillwagon et al., "Fundamentals of Topographic Substrate Levelling", J. Appl. Phys. 63(11), Jun. 1, 1988, pp. 5251-5258.
Wilson et al., "Effect of Circuit Structure on Planarization Resist Thickness," J. Electrochem. Soc., May 1986, pp. 981-984.
Crapella et al., "Planarization by Two-Resist Level," J. Electrochem. Soc., Mar. 1988, pp. 683-685.
Gokan et al., "Uniform Polymer Coating Technique for an Etch-Back Planarization Process Using Low Molecular Weight Polymers," J. Electrochem. Soc., Apr. 1988, pp. 10-19-1021.
Stillwagon et al., "Planarization of Substrate Topography by Spin Coating," J. Electrochem. Soc., Aug. 1987, pp. 2030-2037.
L. K. White, "Planarization Properties of Resist and Polyimide Coatings," J. Electrochem. Soc., Jul. 1983, pp. 1543-1548.
Ikeno et al., "Effects of Superficial Topography on Uniformity of Spun-On Resist Film," Extended Abstracts, vol. 88-2, The Electro-Chemical Society, Fall Meeting, Chicago, Ill., Oct. 9-14, 1988, pp. 1041-1042.

Primary Examiner—Brian E. Hearn
Assistant Examiner—Kevin Pilardat
Attorney, Agent, or Firm—Lowe, Price, LeBlanc & Becker

[57] ABSTRACT

A photoresist of sufficient thickness to fill a scribe line is applied on an entire substrate. Then, the photoresist is exposed through a photomask having a pattern corresponding to the scribe line and is thereafter developed. A photosensitized gelatin is applied by spin-coating on the flat substrate obtained in this process, patterned, and then dyed, to obtain a color filter array.

17 Claims, 10 Drawing Sheets

METHOD FOR FORMING FILM OF UNIFORM THICKNESS ON SEMICONDUCTOR SUBSTRATE HAVING CONCAVE PORTION

BACKGROUND OF THE INVENTION

1. Field of the Invention

The present invention relates generally to a film forming method, and more particularly, to a method for forming a film of uniform thickness on a semiconductor substrate having a concave portion.

2. Description of the Background Art

In the manufacturing process of a semiconductor device, fine shapes such as a transistor and an interconnection are formed on a semiconductor substrate through complex processes including a plurality of times of the photolithographic process. A complex irregular shape can be formed on the substrate through such processes. In the subsequent photolithographic process, nonuniformity of thickness of a photoresist film due to such an irregular shape is caused in applying a photoresist material by spin-coat. In particular, a scribe line which is a trench for isolating a plurality of chips formed on the substrate presents irregularity larger in scale than fine irregularity inside of a chip, so that nonuniformity of thickness of the resist film caused by the irregularity becomes larger.

Figure 1A:
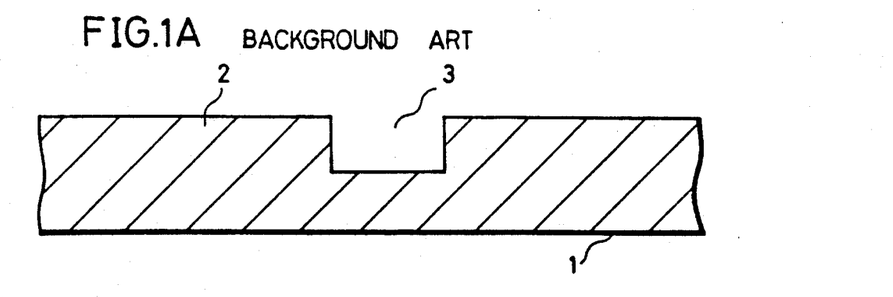
FIG. 1A to 1D are cross sectional views showing manufacturing processes of a semiconductor device in a film-forming method which is the background of the present invention.

FIG. 1A to 1D are cross sectional view showing manufacturing processes of a semiconductor device in a film forming method which is the background of the present invention. As shown in FIG. 1A, a scribe line 3 is provided on a semiconductor substrate 1 for isolating chips 2. The width of the scribe line 3 is 80 to 150 $\mu$m and the depth thereof is 1 to 5 $\mu$m.

Figure 1B:
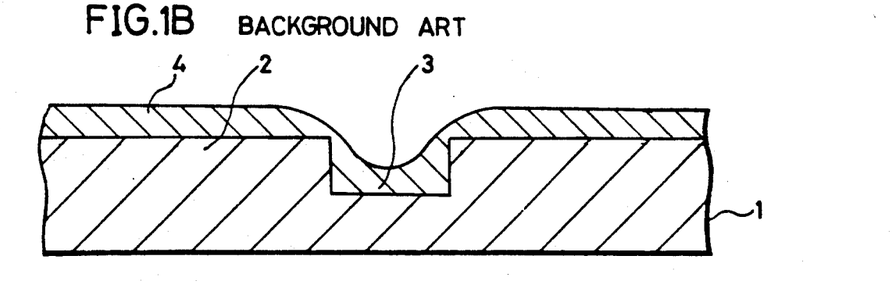
Figure 1C:
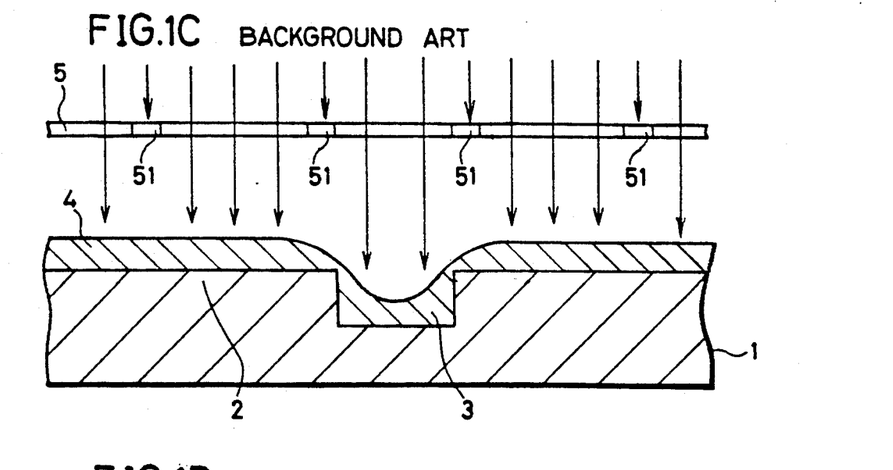
Figure 1D:
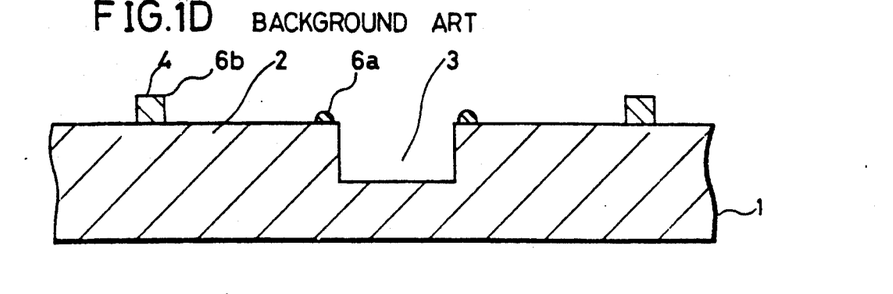

When a photoresist of, for example, a positive type is directly applied to this semiconductor substrate 1, e.g., by spin-coating, the thickness of the applied photoresist 4 becomes thinner in the vicinity of the scribe line 3 than that in another portion, as shown in FIG. 1B. When a predetermined region of such a photoresist of non-uniform thickness is irradiated with light (represented by an arrow) using a photomask 5 having patterns 51 of the same line width as shown in FIG. 1C and then developed, a photoresist pattern 6a in the vicinity of the scribe line 3 becomes thinner and narrower than a photoresist pattern 6b far away therefrom.

Figure 2A:
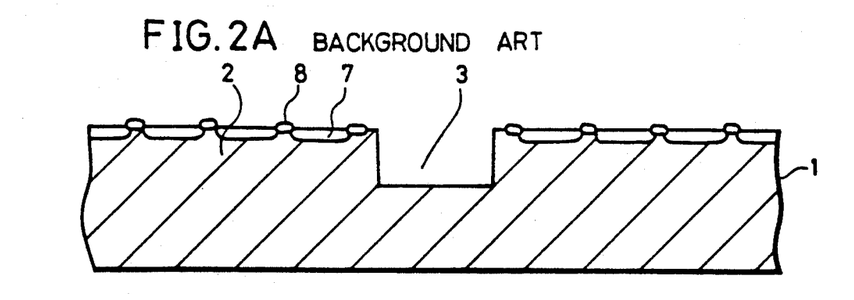
FIGS. 2A to 2D are cross-sectional views illustrating other manufacturing processes of a semiconductor device in the film-forming method which is the background of the present invention.
Figure 2B:
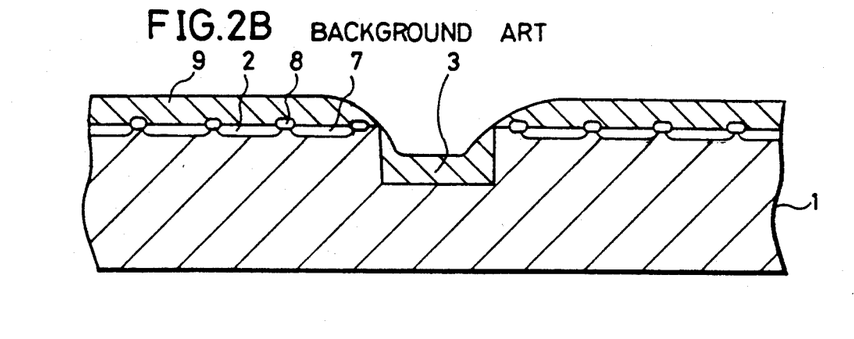

FIGS. 2A to 2B are cross sectional view showing other manufacturing processes of a semiconductor device in the film forming method which is the background of the invention, showing a case in which there is formed a pattern of an on-chip type color filter material for a solid state imager. As shown in FIG. 2A, a lot of photodiodes 7 are arranged in a line manner or an array manner on chips 2 isolated from each other by a scribe line 3 on a semiconductor substrate 1. An oxide film 8 for isolation is formed between the adjacent two photodiodes 7. A material known to be suitable for such a film 8 is silicon dioxide. The photodiodes 7 are arranged closer to the scribe line 3.

Figure 2C:
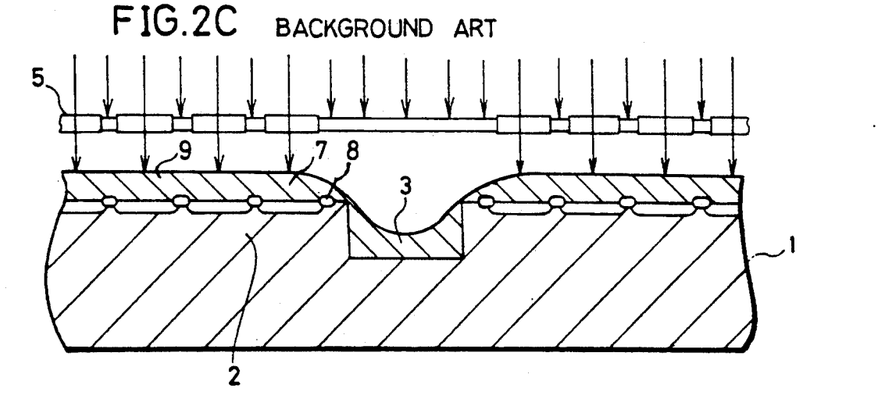
Figure 2D:
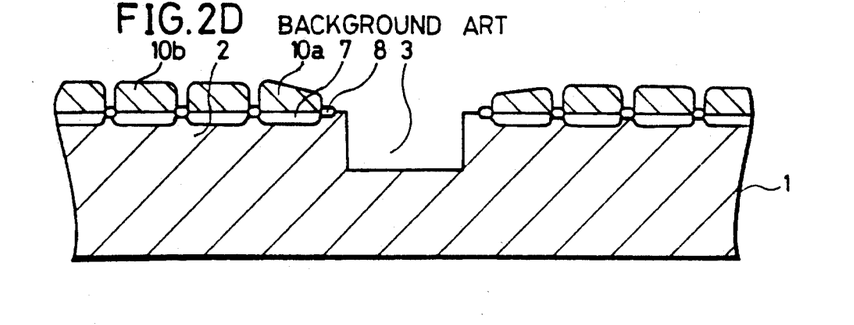

When a negative type photosensitized gelatin is applied on such a semiconductor substrate 1 as a color filter material, the thickness of a photosensitized gelatin film 9 generally becomes thinner in the vicinity of the scribe line, as shown in FIG. 2B. Then, when predetermined regions of the gelatin photosensitive film 9, for example, regions on the photodiodes 7 are selectively irradiated with light using a photomask 5 as shown in FIG. 2C and then developed, a gelatin pattern 10a in the vicinity of the scribe line 3 becomes thinner than a gelatin pattern 10b far away therefrom, as shown in FIG. 2D. Thereafter, each gelatin pattern is subjected to dyeing processing. There occurs a difference in spectral transmittance characteristics between the dyed gelatin pattern 10a in the vicinity of the scribe line 3 and the dyed gelatin pattern 10b far away therefrom even if the gelatin patterns are respectively color filters of the same color. Thus, there occurs a difference between respective spectral sensitivity characteristics of the photodiodes 7 corresponding to the gelatin patterns 10a and 10b.

In the above described two examples, the thickness of the gelatin photosensitive film in the vicinity of the scribe line is thinner than that in another portion. However, a coating material may protrude adjacent to the side of the scribe line at the time of application by spinning depending on the nature of the material to be coated, for example the viscosity, the surface tension and the like. Such a phenomenon is described in an article by Ikeno et. al., entitled "Effects of Superficial Topography on Uniformity of Spun-on Resist Film", EXTENDED ABSTRACTS in Fall Meeting of The Electrochemical Society held in October, 1988 Vol. 88-2, pp. 1041-1042.

As described in the foregoing, in the conventional film forming method, a film of a photoresist, a color filter material or the like becomes thin or thick in the vicinity of a concave portion such as a scribe line on a semiconductor substrate. Thus, uniformity of the pattern size of the resist or the thickness of the film is decreased, so that a semiconductor device as designed cannot be obtained. In addition, spectral transmittance characteristics of a color filter film and spectral response of the photodiode become non-uniform depending on the position of the gelatin pattern on the chip. Thus, the characteristics of a solid state imager so formed are not entirely satisfactory.

In order to solve the above-described problems, the thickness of the film is made thick in practice, so that the effect due to the difference in thickness is decreased. However, in such a case, the resolution in patterning the film is lowered and the reliability is decreased In addition, much time is required for exposure and development.

SUMMARY OF THE INVENTION

An object of the present invention is to provide a method for forming film which is uniform in thickness irrespective of whether it is located in the vicinity of or far away from a concave portion on a semiconductor substrate.

The film-forming method according to the present invention comprises the steps of forming a film of a first material for filling a concave portion on a semiconductor substrate, selectively removing this film of a first material in a portion other than the concave portion, and forming a film of a second material thereon.

In accordance with another aspect of the present invention, a color filter is formed on a semiconductor substrate after filling a scribe line on a semiconductor substrate.

In accordance with still another aspect of the present invention, a plurality of chip regions each having a solid state imager comprising a photoelectric converting portion and a driving circuit formed therein and a concave portion for dividing the plurality of chip regions are formed on a semiconductor substrate. A color filter array is formed after filling the concave portion.

In a method according to the present invention, a concave portion is filled with a first material and the first material in a portion other than the concave portion is selectively removed, so that a flat surface is obtained. A film of a second material is formed on the flat surface, so that this film becomes uniform.

Thus, the color filter manufactured in the film forming method according to the present invention has uniform spectral transmittance characteristics, so that characteristics of a solid state imager having this color filter is improved.

DESCRIPTION OF THE PREFERRED EMBODIMENTS

FIGS. 3A to 3G are cross-sectional views illustrating manufacturing processes of a semiconductor device in a film forming method according to the present invention.

Figure 3A:
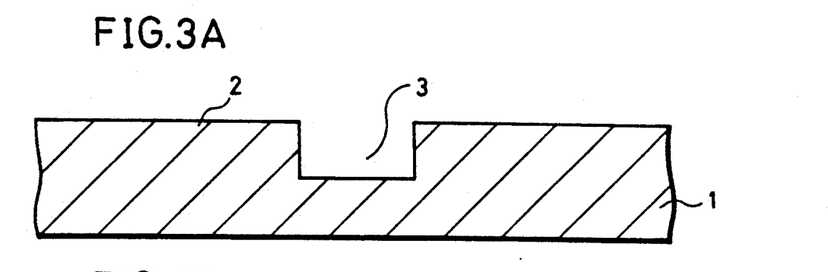
FIGS. 3A to 3G are cross-sectional views illustrating manufacturing processes of a semiconductor device in a film-forming method according to a first embodiment of the present invention.
Figure 3B:
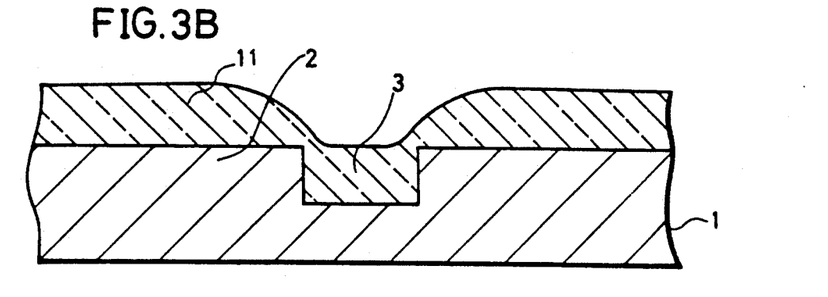
Figure 3C:
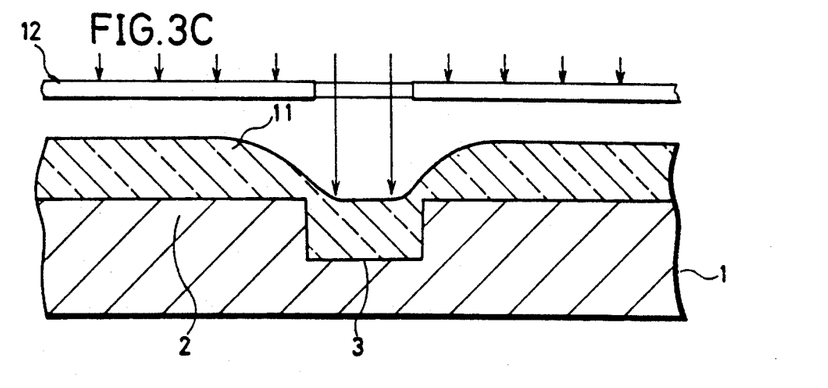
Figure 3D:
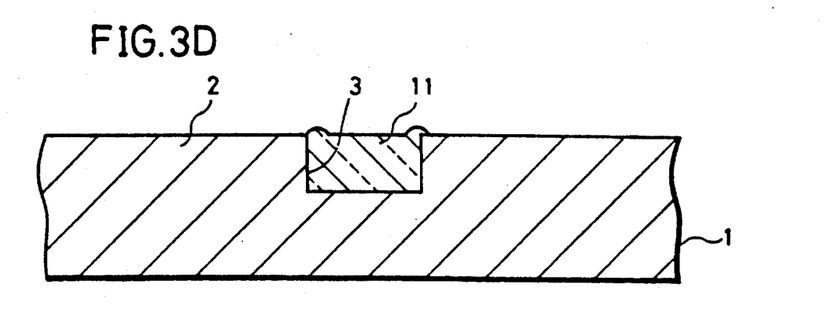
Figure 3E:
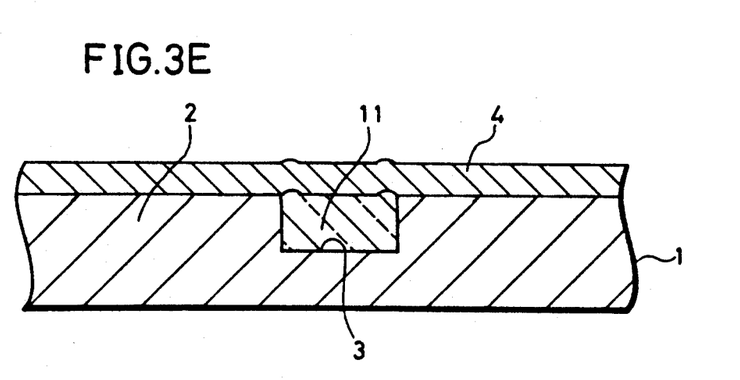
Figure 3F:
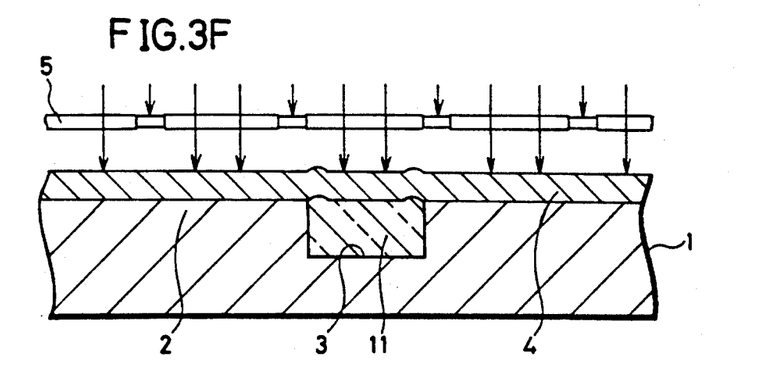
Figure 3G:
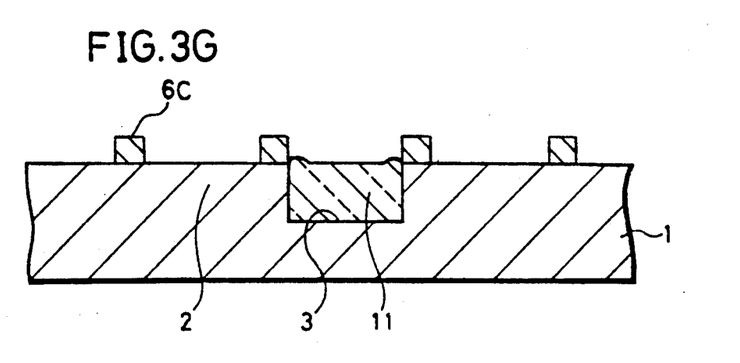

As shown in FIG. 3A, a scribe line 3 for isolating chips 2 is provided on a semiconductor substrate 1. Then, as shown in FIG. 3B, a negative type photoresist 11 of sufficient thickness to fill the scribe line 3 is applied by spin-coating. Then, as shown in FIG. 3C, the photoresist 11 on the scribe line 3 is exposed to UV light using a photomask 12 having a pattern corresponding to the scribe line 3. When the resist pattern is developed using an organic developer and baked, the scribe line 3 is selectively filled with the negative type photoresist 11 as shown in FIG. 3D, so that the surface becomes flat throughout. A positive type photoresist 4 is applied thereon by spin-coating. Since the negative type photoresist 11 is insoluble in a solvent for the positive type photoresist by exposing, developing and baking processing, a film of a positive type photoresist 4 of uniform thickness is obtained as shown in FIG. 3E. Subsequently, the film is exposed to light through a photomask 5 as shown in FIG. 3F and developed, so that photoresist patterns 6c are obtained as shown in FIG. 3G. There is no difference in the patterns 6c in the vicinity of and far away from the scribe line 3.

Figure 4A:
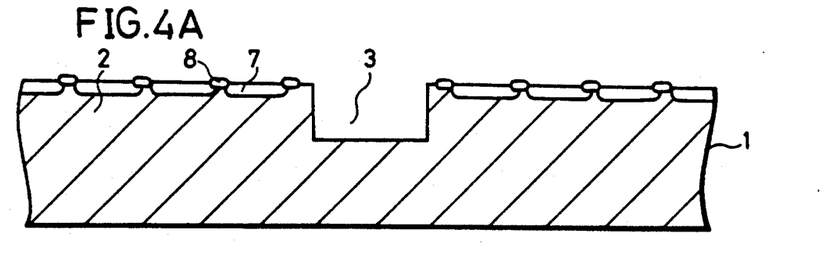
FIGS. 4A to 4G are cross-sectional views showing manufacturing processes of a semiconductor device in a film forming method according to a second embodiment of the present invention.
Figure 4B:
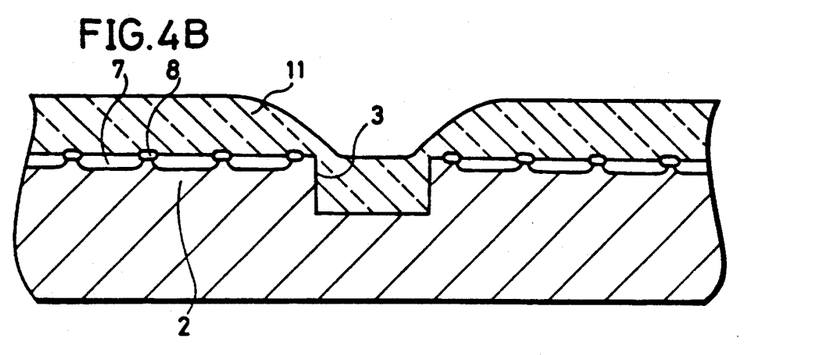
Figure 4C:
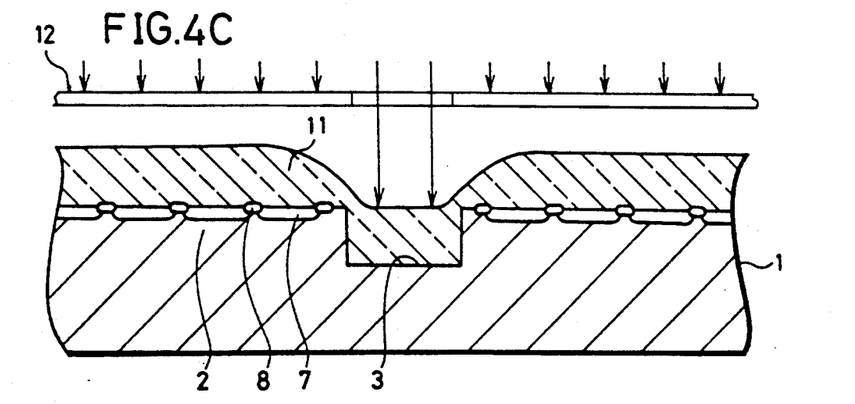
Figure 4D:
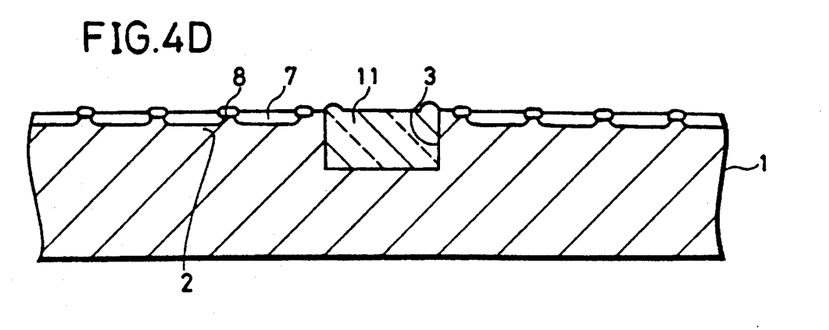
Figure 4E:
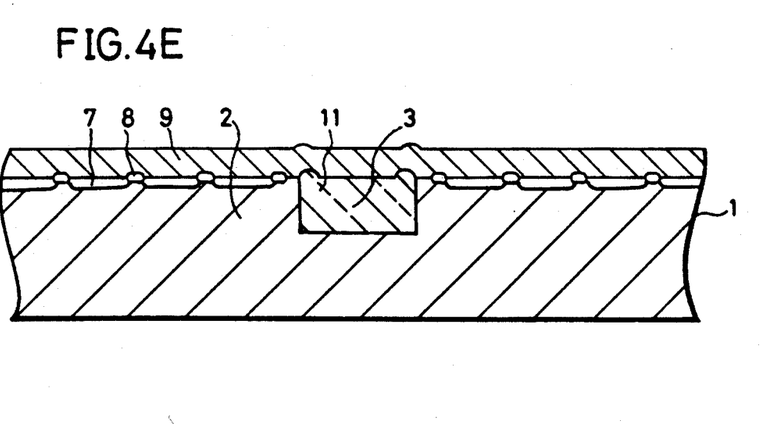
Figure 4F:
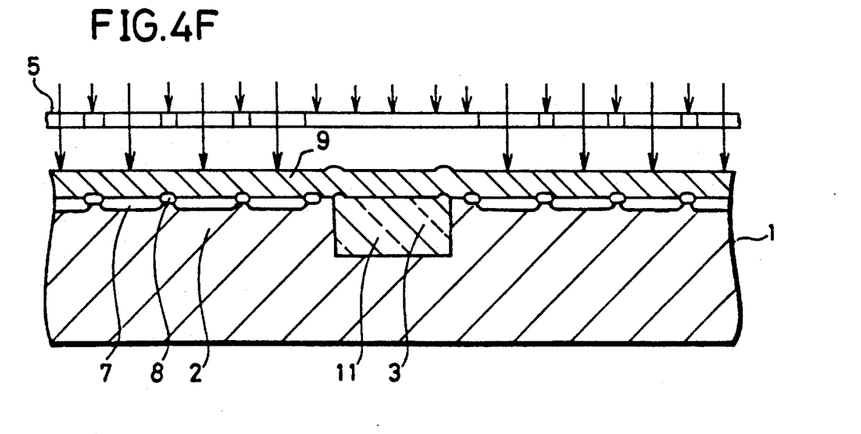
Figure 4G:
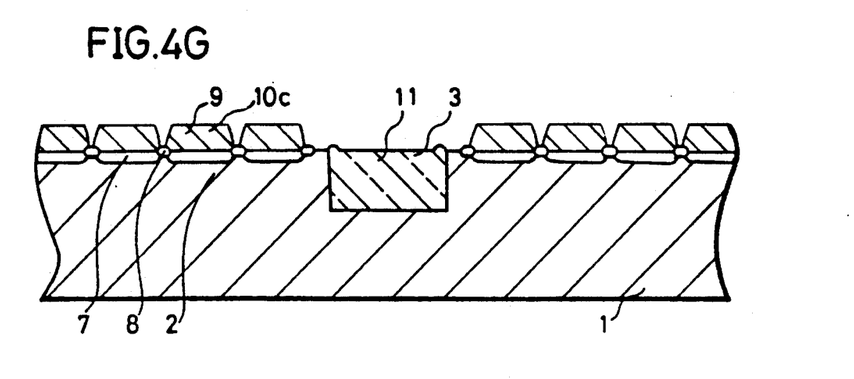

FIG. 4A to 4G are cross-sectional views illustrating manufacturing processes of a semiconductor device in a film forming method according to another embodiment of the present invention, showing a case in which a pattern of an on-chip type color filter material for a solid state imager is formed. FIG. 4A is the same as FIG. 2A and hence, the description thereof is omitted. As shown in FIG. 4B, a negative type photoresist 11 soluble in organic solvent is applied to sufficient thickness to fill a scribe line 3. Then, as shown in FIG. 4C, the photoresist 11 on the scribe line 3 is exposed to light using a photomask 12 having a pattern corresponding to the scribe line 3. When the resist pattern is developed and baked, the scribe line 3 is selectively filled with the negative type photoresist 11 as shown in FIG. 4D, so that the surface becomes flat throughout. When a photosensitized gelatin soluble in water is applied thereon by spin-coating, a gelatin photosensitive film 9 of uniform thickness is obtained as shown in FIG. 4E. Then, when predetermined regions of the gelatin photosensitive film 9, for example, regions on photodiodes 7 are exposed to deep UV light using a photomask 5 as shown in FIG. 4F and then developed, gelatin patterns 10c are obtained as shown in FIG. 4G. There is no difference in thickness between the patterns 10c in the vicinity of and far away from the scribe line 3. That is, the patterns on any photodiodes 7 in a chip are uniform in thickness and width. Thereafter, each of the gelatin patterns is subjected to dyeing processing, so that a color filter array is obtained.

Although in FIG. 3G showing the first embodiment and FIG. 4G showing the second embodiment, the photoresist 11 is left in the scribe line 3, this photoresist 11 may be removed in the subsequent processes or may be left.

Although in the above described first and second embodiments, a negative type photoresist is used as a first material for filling a concave portion such as a scribe line 3, a material having either negative or positive type sensitivity may be used, provided it is insoluble in a solvent including a second material used as a film formed after filling the concave portion to be a flat surface.

In the above-described second embodiment, color filters are formed on the same surface. Description is now provide on an example in which color filters are stacked.

Figure 5A:
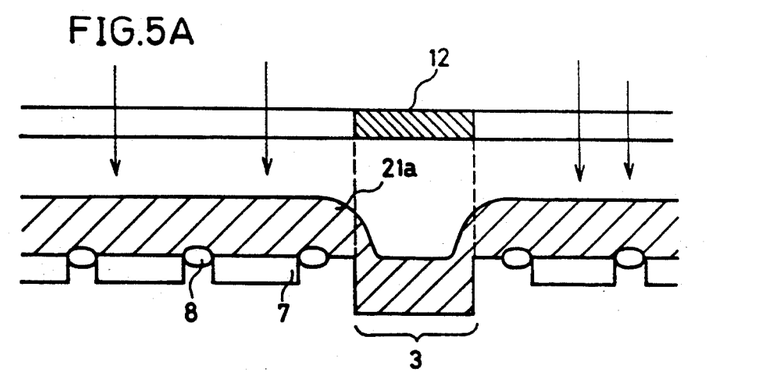
FIGS. 5A to 5D are cross-sectional views illustrating manufacturing processes of a solid state imager in a film-forming method according to a third embodiment of the present invention.

First, as shown in FIG. 5A, a positive type photosensitive polymer 21a of sufficient thickness to considerably fill a deep stepped portion such as a scribe line 3 is formed on a Si substrate having a photoelectric converting portion and a driving portion formed thereon by using spin-coating, or the like.

Figure 5B:
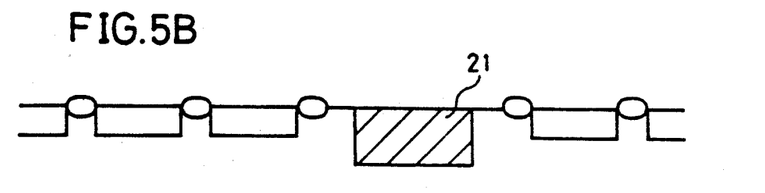

Subsequently, a portion other than the stepped portion is exposed by light using a photomask 12. Then, as shown in FIG. 5B, the portion is removed by development, to form a filled layer 21.

Figure 5C:
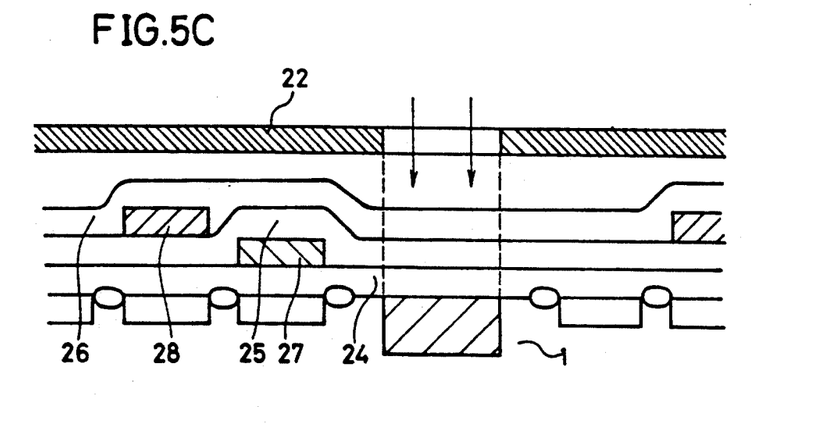

Then, as shown in FIG. 5C, a smoothening layer 24 is formed on a semiconductor substrate 1.

Then, a base material used for a filter such as gelatin, casein, PVA (polyvinyl alcohol) or the like having photosensitivity by adding ammonium dichromate or the like is applied by using a spin-coating procedure, or the like, to form a filter pattern using photolithographic techniques. This filter pattern is dyed using a dyeing method, to form a first color filter layer 27 having desired spectral transmittance characteristics.

Similarly, a second color filter layer 28 is formed through an intermediate layer 25 formed of a transparent polymer, and then a protective layer 26 is formed of a transparent polymer. A positive type photosensitive polymer is used as an interlayer film such as the smoothening layer 24, the intermediate layer 25 and the protective layer 26.

Finally, the unnecessary transparent polymers 24, 25 and 26 and the filled layer 21 on the scribe line 3 are simultaneously exposed to light using a photomask 22.

Figure 5D:
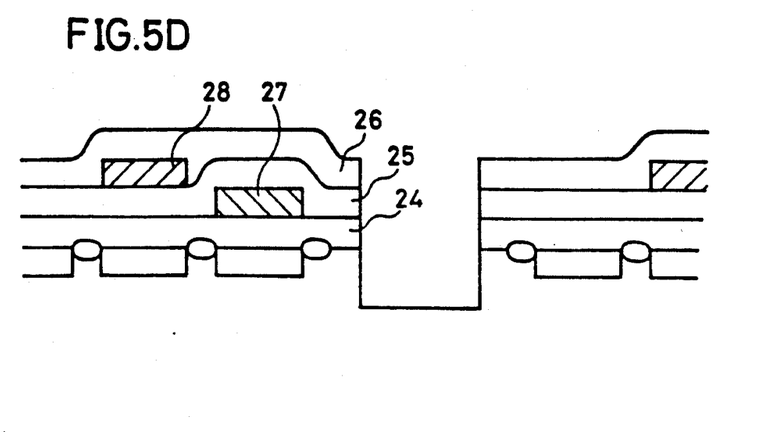

Then, as shown in FIG. 5D, the above-described layers on the scribe line are simultaneously removed by development.

Although in the above-described third embodiment, the filled layer is formed of the positive type photosensitive polymer, it may be formed of a negative type photosensitive polymer. Description is now provided of an example in which a negative type photosensitive polymer is used.

Figure 6A:
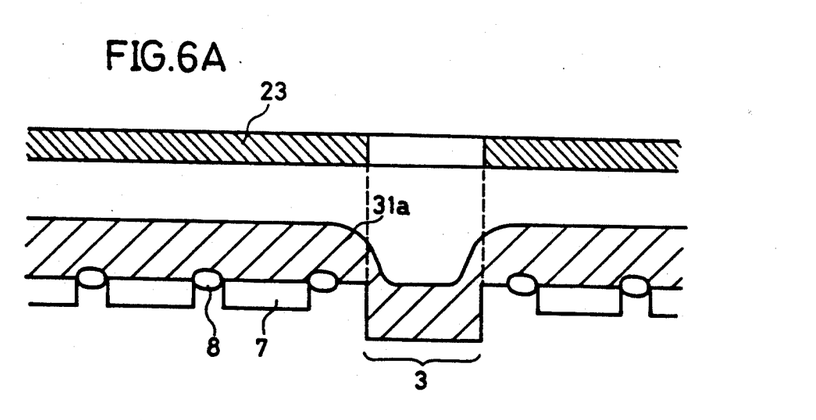
FIGS. 6A to 6D are cross-sectional views illustrating manufacturing processes of a solid state imager in a film-forming method according to a fourth embodiment of the present invention.

First, as shown in FIG. 6A, a negative type photosensitive polymer 31a of sufficient thickness to considerably fill a deep stepped portion such as a scribe line 3 is formed using application by spin-coating, or the like.

Figure 6B:
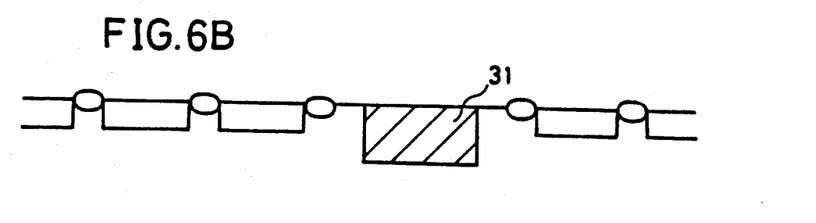

Subsequently, the stepped portion to be filled is exposed to light using a photomask 23. Then, as shown in FIG. 6B, an unnecessary portion is removed by development, to form a filled layer 31.

Figure 6C:
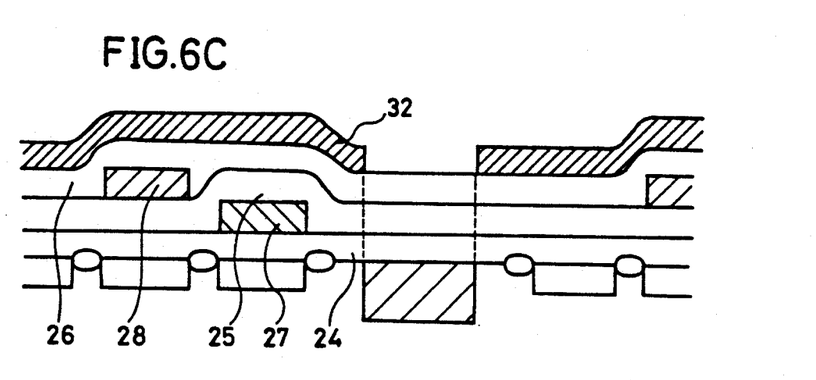
Figure 6D:
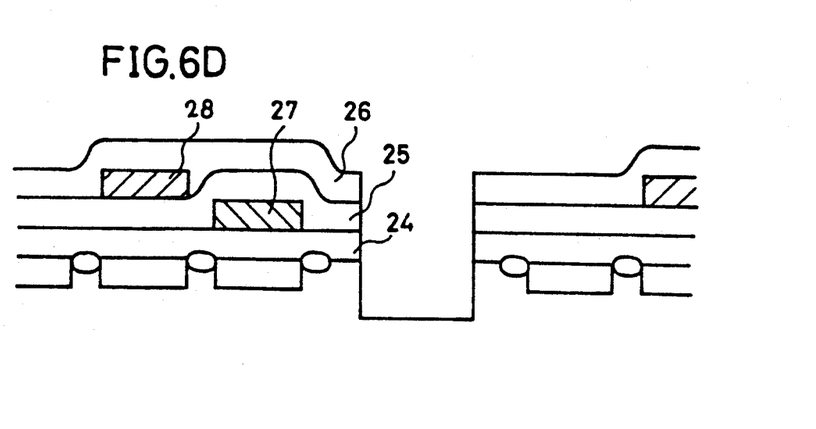

In the same manner as that in the above-described third embodiment, a color filter array comprising a smoothening layer 24, a first color filter layer 27, an intermediate layer 25, a second color filter layer 28 and a protective layer 26 is formed as shown in FIG. 6C and then, a photoresist 32 is applied. Then, as shown in FIG. 6D, the filled layer 31 and the polymer layers 24, 25 and 26 are removed by etching, utilizing the above-described resist 32 as a mask.

Finally, the remaining photoresist 32 is stripped.

It does not matter whether materials of the filled layer 31 and the transparent interlayer films 24, 25 and 26 are inorganic or organic provided they can be etched. However, it is desirable to select the materials, together with etching materials, such that the etching speed of the photoresist 32 is high and the filled layer 31 and the transparent interlayer films 24, 25 and 26 are simultaneously etched.

The filled layer 31 may optionally be formed of a positive type photosensitive polymer, and the transparent interlayer films 24, 25 and 26 may then be formed of a negative type resin or a thermosetting resin. In this case, the films 24, 25 and 26 are removed by etching utilizing the photoresist 32 as a mask, and the filled layer 31 is removed by exposure and development. The films 24, 25 and 26 and the filled layer 31 may all be removed by etching.

Figure 7:
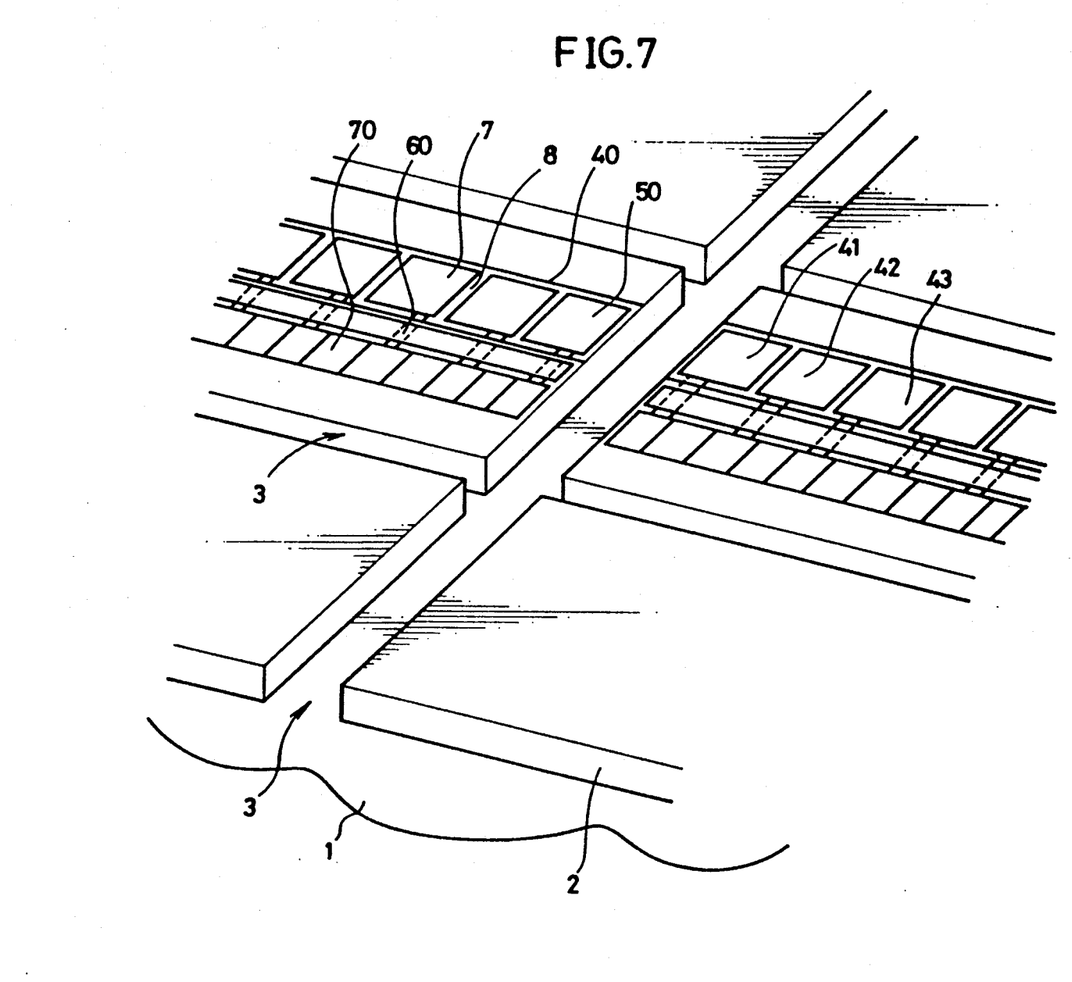
FIG. 7 is a perspective view showing a semiconductor substrate, in which a linear imagers are formed, according to the third and fourth embodiments.

FIG. 7 shows a semiconductor substrate, in which a linear imagers are is formed, according to third and fourth embodiments. As shown in FIG. 7, a scribe line 3 is provided lengthwise and breadthwise on a semiconductor substrate 1. Each of chip regions 2 divided by the scribe line 3 is provided with a photoelectric converting portion 50 having photodiodes 7 arranged in a single line, a transfer gate 60 for reading out the charges from each of the photodiodes, and a CCD (Charge Coupled Device) 70 for transferring the charges as read out. A color filter array 40 is formed on the photoelectric converting portion 50. The color filter array 40 comprises, for example, a red filter 41, a green filter 42 and a blue filter 43. Although a linear imagers having RGB-color filter arrays are shown in FIG. 7, any filter may be used provided it constitutes the color filter array. In addition, the photodiodes may be arranged in a matrix.

Although a material having sensitivity is used as a first material for filling a concave portion such as a scribe line, a material having no sensitivity, e.g., a thermosetting resin, may be used. Description is now provided of such an embodiment.

Figure 8A:
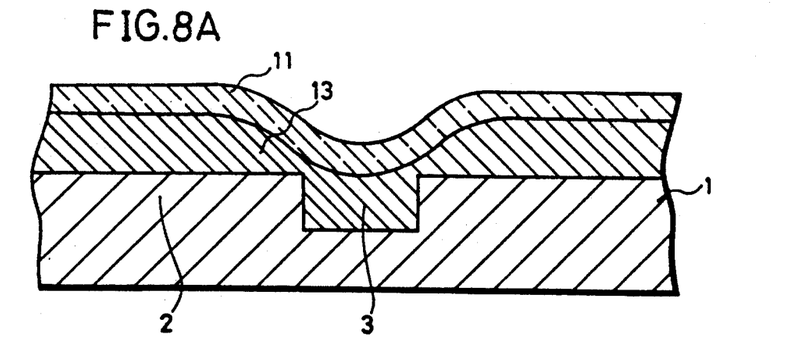
FIGS. 8A to 8D are cross-sectional views illustrating manufacturing processes of a semiconductor device in a film-forming method according to a fifth embodiment of the present invention.
Figure 8B:
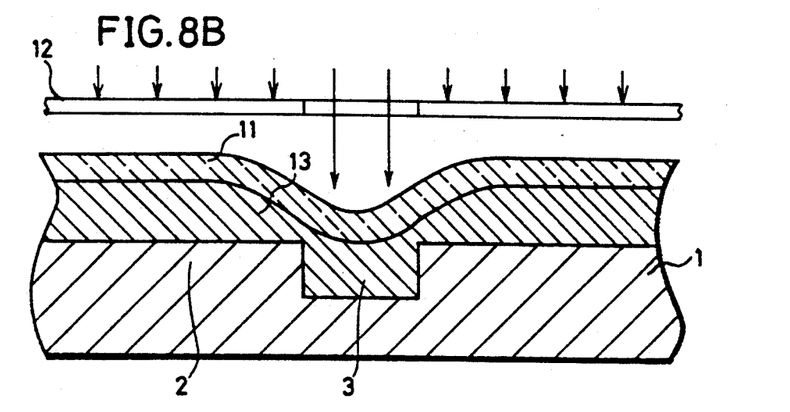
Figure 8C:
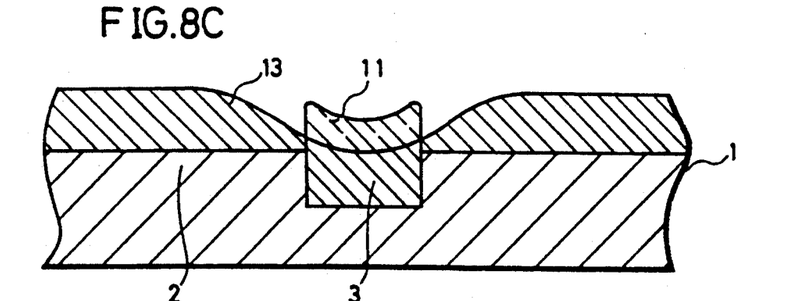
Figure 8D:
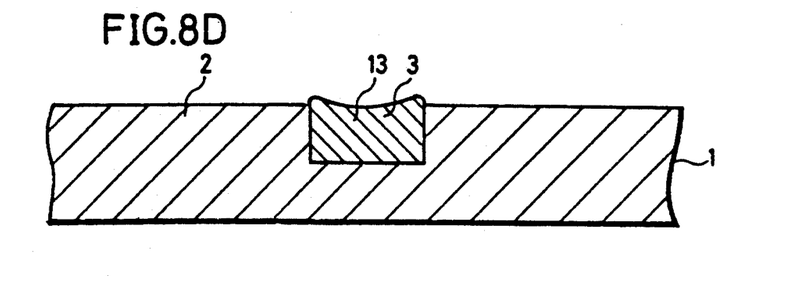

FIG. 8A to 8D are cross-sectional views illustrating processes of a semiconductor substrate corresponding to the processes shown in FIGS. 3B to 3D. The other processes are the same as those in the first embodiment, and, the description thereof is omitted. In FIG. 8A, a thermosetting resin 13 is applied on a semiconductor substrate 1, to form a film of sufficient thickness to fill a scribe line 3. A negative type photoresist 11 is applied thereon. As shown in FIG. 8B, a photoresist on the scribe line 3 is exposed to light using a mask 12 having a pattern corresponding to the scribe line 3. When the resist pattern is developed and baked, the photoresist 11 remains only in a portion corresponding to the scribe line 3, as shown in FIG. 8C. The thermosetting resin in a portion other than the portion corresponding to the scribe line 3 is removed by etching, utilizing the remaining photoresist 11 as a mask. When the photoresist 11 is removed in known manner by dry etching using oxygen plasma or by organic solvent, the surface becomes flat throughout, as shown in FIG. 8D.

Although in the above-described embodiment, a thermosetting resin is used as a first material, the first material is not limited to the same. For example, it may be organic or inorganic provided it can be etched.

Although in the above-described embodiment, a scribe line was discussed as an example of a concave portion, the concave portion is not limited to the same. For example, the concave portion may be a relatively large stepped portion formed on a semiconductor substrate, in which case a film of the same uniform thickness as that in the above-described embodiment can be formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A film forming method comprising the steps of:
    forming on a major surface of a semiconductor substrate having a concave portion a film of sufficient thickness to fill said concave portion with a first material;
    selectively removing said first material such that said first material remains in said concave portion and substantially fills the same; and
    forming a film of a second material of substantially uniform thickness extending on said first material remaining in said concave portion and on said major surface other than said concave portion;
    wherein said first material comprises a non-photosensitive material and said second material comprises a photosensitized gelatin material soluble in water, and wherein the step of selectively removing said first material comprises the steps of applying a photosensitive film on said first material, exposing said photosensitive film to light through a predetermined mask and developing the same, to remove the photosensitive film in a portion other than said concave portion, and etching said first material utilizing as a mask said photosensitive film remaining on said concave portion.

2. The film forming method according to claim 1, wherein:
said step of forming said first film comprises a step of spin-coating said first material on said substrate including said concave portion.

3. The film forming method according to claim 1, wherein:
said light comprises ultraviolet (UV) light.

4. The film forming method according to claim 1, wherein:
said first material comprises a negative type photoresist material soluble in organic solvent.

5. The film forming method according to claim 1, wherein:
said step of forming said film of said second material comprises a step of spin-coating the same.

6. The film forming method according to claim 1, wherein:
said first material comprises a negative type photoresist material soluble in organic solvent; and
said step of forming said film of said second material comprises a step of spin-coating the same.

7. The film forming method according to claim 1, wherein:
said first and second materials are selected such that one has a positive sensitivity while the other has a negative sensitivity and the two materials are not soluble in the same solvent.

8. A film-forming method applied to the manufacture of a color filter array, comprising the steps of:
forming on a major surface of a semiconductor substrate having a scribe line a first film of sufficient thickness to fill said scribe line with a first material;
selectively removing said first material, such that said first material remains in said scribe line;
forming a second film on said first material remaining in said concave portion and said major surface other than said concave portion to form a color filter array, and
forming on said second film a plurality of transparent interlayer films comprising an etchable material and with at least one color filter layer between said second film and the closest thereto of said interlayer films, wherein
said first material comprises a positive type photosensitive polymer,
said second film comprises a positive type photosensitive polymer, and
said step of forming said second film comprises a step of spin-coating the material thereof.

9. The film forming method according to claim 8, wherein:
said step of forming said first film comprises a step of spin-coating said first material on said substrate including said concave portion.

10. The film forming method according to claim 8, wherein:
said first material comprises a positive type photosensitive polymer.

11. The film forming method according to claim 10, wherein:
said second film comprises a positive type photosensitive polymer.

12. The film forming method according to claim 11, wherein:
said step of forming said second film comprises a step of spin-coating the material thereof.

13. The film forming method according to claim 8, wherein:
said substrate outside of said scribe line comprises a photosensitive converting portion, said at least one color filter layer being disposed to cover at least a part of the same.

14. A method for forming a film on a semiconductor substrate having a plurality of chip regions, each having a solid state imager comprising a photoelectric converting portion and a driving portion formed therein, and a concave portion for dividing said plurality of chip regions, comprising the steps of:
filling said concave portion with a first material;
forming a smoothening film on said semiconductor substrate having said concave portion filled with said first material to form a color filter array; and
removing said first material except from said concave portion which is filled therewith, and thereafter forming the color filter array.

15. A film forming method, comprising the steps of:
forming on a major surface of a semiconductor substrate having a concave portion a film of sufficient thickness to fill said concave portion with a first non-photosensitive, negative type photoresist material soluble in an organic solvent;
selectively removing said first material such that said first material remains in said concave portion and substantially fills the same; and
forming a film of a second material of substantially uniform thickness extending on said first material remaining in said concave portion and on said major surface other than said concave portion,
wherein the step of selectively removing said first material comprises the steps of
applying a photosensitive film on said first material,
exposing said photosensitive film to light through a predetermined mask and developing the same, to remove the photosensitive film in a portion other than said concave portion, and
etching said first material utilizing as a mask said photosensitive film remaining on said concave portion.

16. The film forming method according to claim 8, wherein:
the step of selectively removing said first material comprises the step of exposing said first material to light through a predetermined mask and then developing said exposed first material.

17. The film forming method according to claim 15, wherein:
forming, on a major surface of a semiconductor substrate having a concave portion, a first film out of a non-photosensitive material having a sufficient thickness to fill said concave portion;
forming a second film out of a photosensitive material on said first film;

removing said second film in other portion than said concave portion through light-exposure through a predetermined mask followed by development of the same; and etching said first film using said second film left on said concave portion as a mask to leave said non-photosensitive material in said concave portion and fully fill said concave portion.

* * * * *

UNITED STATES PATENT AND TRADEMARK OFFICE
CERTIFICATE OF CORRECTION

PATENT NO. : 5,135,891

DATED : August 4, 1992

INVENTOR(S) : Ikeno et al

It is certified that error appears in the above-identified patent and that said Letters Patent is hereby corrected as shown below:

Column 5, line 49, delete "high" and insert --lower than those of the filled layer 31 and the transparent interlayer films 24, 25 and 26--

Column 5, line 62, delete "is"

Signed and Sealed this

Twenty-sixth Day of October, 1993

*Attest:*

BRUCE LEHMAN

*Attesting Officer*     *Commissioner of Patents and Trademarks*